United States Patent [19]

Choi

[11] Patent Number: 5,049,952
[45] Date of Patent: Sep. 17, 1991

[54] THIN FILM TRANSISTOR FOR USE IN A FLAT PLATE DISPLAY

[75] Inventor: Kwangsu Choi, Suwon, Rep. of Korea

[73] Assignee: Samsung Electron Devices Co., Ltd., Rep. of Korea

[21] Appl. No.: 527,270

[22] Filed: May 23, 1990

[30] Foreign Application Priority Data

Dec. 30, 1989 [KR] Rep. of Korea ............... 89-21037

[51] Int. Cl.$^5$ ............... H01L 45/00; H01L 27/12; H01L 49/02; H01L 29/78
[52] U.S. Cl. ................................ 357/4; 357/2; 357/23.7
[58] Field of Search .............. 357/23.7, 30, 2, 4; 350/334, 336, 340

[56] References Cited

U.S. PATENT DOCUMENTS

| | | | |
|---|---|---|---|
| 4,803,536 | 2/1989 | Tuan | 357/23.13 |
| 4,821,092 | 4/1989 | Noguchi | 357/4 |
| 4,907,861 | 3/1990 | Muto | 350/336 |
| 4,948,231 | 8/1990 | Aoki et al. | 350/334 |

FOREIGN PATENT DOCUMENTS

| | | | |
|---|---|---|---|
| 60-170261 | 9/1985 | Japan | 357/23.7 |
| 1-068968 | 3/1989 | Japan | 357/23.7 |
| 1-082674 | 3/1989 | Japan | 357/23.7 |

Primary Examiner—Andrew J. James
Assistant Examiner—Stephen D. Meier
Attorney, Agent, or Firm—Cushman, Darby & Cushman

[57] ABSTRACT

A thin film transistor for use in a flat plate display comprising an amorphous silicon layer, a gate electrode, and a source electrode partially separated into a first source subelectrode and second source subelectrode, wherein said gate and source electrodes are deposited on said amorphous silicon layer to form a cross over with each other, a drain electrode connected with said gate electrode, and a picture element electrode connected with said drain electrode.

1 Claim, 2 Drawing Sheets

THIN FILM TRANSISTOR FOR USE IN A FLAT PLATE DISPLAY

BACKGROUND OF THE INVENTION

This invention concerns a thin film transistor for use in a flat plate display, and more particularly the source electrode thereof.

Generally, thin film transistors are used as switching elements for flat plate displays because they are characterized by low voltage, low power consumption, light weight and high quality visual reproduction. Such a thin film transistor has a cross-sectional structure as shown in FIG. 3. In producing the thin film transistor, first metal thin film of chromium (Cr) is deposited on a glass substrate 1 to form gate electrode 2, over which a gate insulating layer 3 of a-Si:N, a semiconductor layer 4 of a-si:H, and an ohmic layer 5 of n+ a-si:H are successively laid by plasma-assisted chemical vapor deposition (PACVD).

Subsequently, the semiconductor layer 4 of a-Si:H thin film and the ohmic layer 5 of n+ a-Si:H thin film are etched by photolithography to form a pattern of active regions. Thereafter, contacting hole is formed so as to contact the source electrode 6 with the gate electrode 2. Subsequently, the source electrode 6 and the drain electrode 7 are made of second metal thin film of aluminium (Al). The ohmic layer 5 of n+ a-Si:H thin film remaining in the channel portion between the source electrode 6 and the drain electrode 7 is removed by dry etching, thereby completing the thin film transistor.

Referring to FIG. 2 which illustrates the plane view of a conventional thin film transistor, the gate electrode 2 and the source electrode 6 are formed to cross each other on amorphous silicon layer. Under the gate electrode 2 is formed drain electrode 7, which is in turn connected with picture element electrode 5. In this case, if the gate electrode 2 and the source electrode 6 are contacted with each other at the crossover, the crossing lines of the gate electrode and the source electrode can not be wholly used, thus decreasing the yield rate.

SUMMARY OF THE INVENTION

The object of the present invention is to provide a thin film transistor for use in a flat plate display that can satisfactorily drive the substrate even if the crossover contact between the source electrode and gate electrode occurs the amorphous silicon layer (i.e. transistor).

According to the present invention, a thin film transistor for use in a flat plate display comprises an amorphous silicon layer, a gate electrode, a source electrode, the two electrodes being deposited on the amorphous silicon form a cross over with each other, a drain electrode connected with the gate electrode, and a picture element electrode connected with the drain electrode. The source electrode is partially separated into two subelectrodes, i.e. first source subelectrode and second source subelectrode.

Thus, if the crossover contact occurs in one source subelectrode, the other subelectrode can drive the substrate.

BRIEF DECRIPTION OF THE ATTACHED DRAWINGS

DETAILED DESCRIPTION OF THE INVENTION

The present invention will now be described more specifically with reference to the drawings attached only by way of example.

Figure 1:
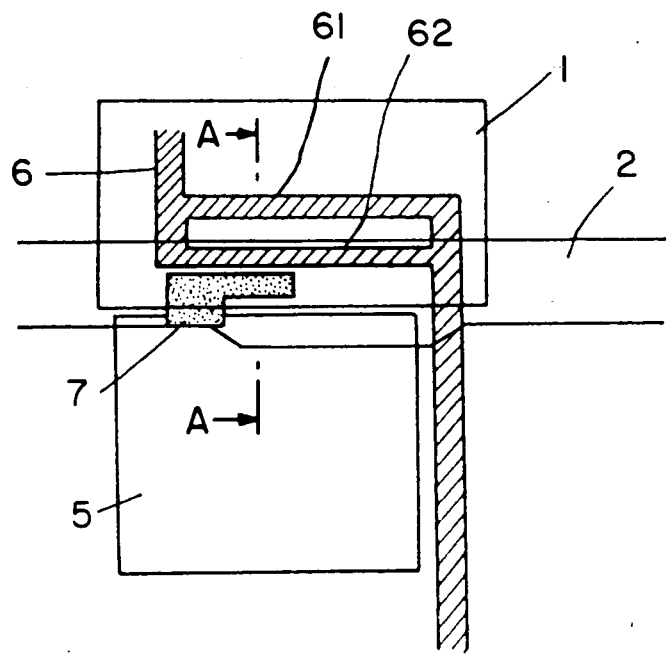
FIG. 1 is a plane view of the inventive thin film transistor.
Figure 2:
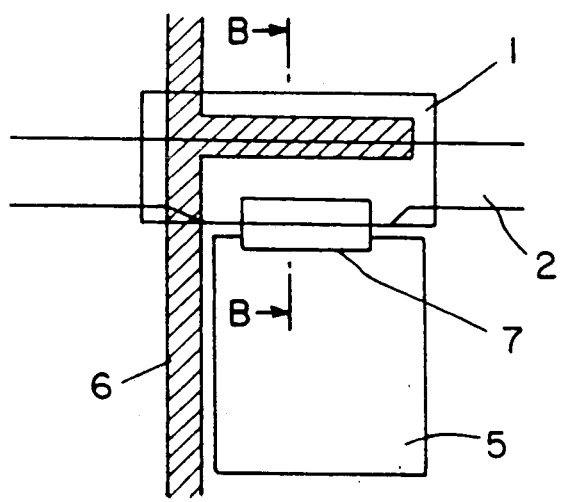
FIG. 2 is a plane view of a conventional thin film transistor.
Figure 3:
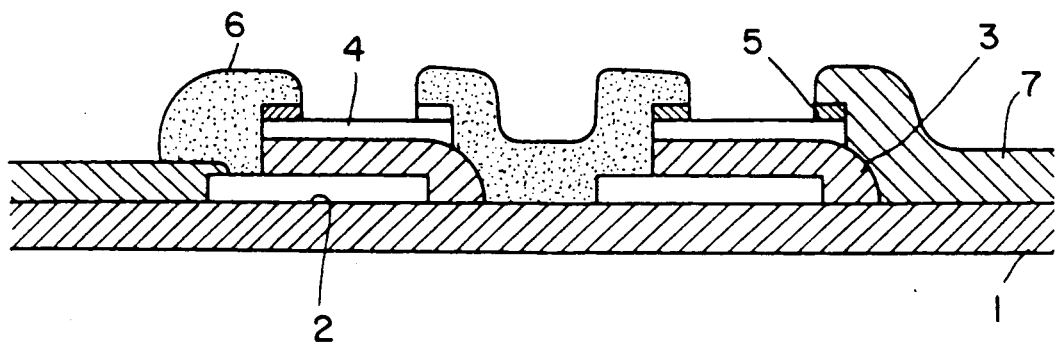
FIG. 3 is a cross-sectional view taken along line B—B of FIG. 2 for illustrating the structure of a typical thin film transistor.
Figure 4:
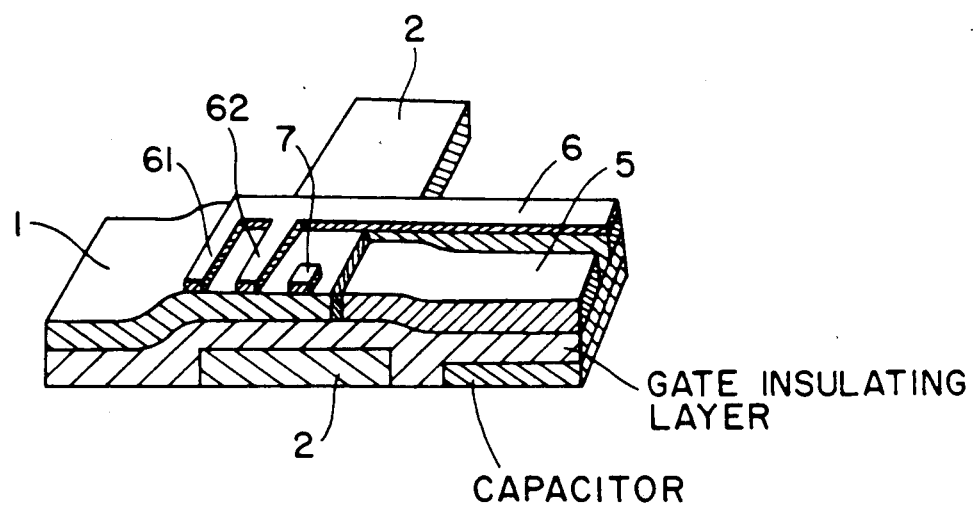
FIG. 4 depicts a cross-sectional perspective view taken along line A—A of FIG. 1.

Referring to FIG. 1, gate electrode 2 and source electrode 6 are deposited on amorphous silicon layer 1 to form a cross-over. The source electrode 6 is partially separated into two subelectrodes, i.e. first source subelectrode 61 and second source subelectrode 62. The gate electrode 2 is connected with drain electrode 7, which is in turn connected with picture element electrode 5.

In operation, if a voltage is applied to the source electrode 6, it flows through the first source subelectrode 61 and the second source subelectrode 62. At this time, if there occurs a crossover contact between the gate electrode 2 and one of the two source subelectrodes 61 and 62, for instance the second subelectrode 62, the second source subelectrode 62 is disconnected from the circuit. However, the first source subelectrode 61 remains connected with the circuit so that the substrate may be driven. Moreover, if a thin film transistor is turned off, there occurs no problem in the display.

As described above, the source electrode is partially separated into two subelectrodes, so that if one of the two subelectrodes makes a crossover contact, the other may drive the substrate, thereby eliminating more than 80% of the defects caused by the crossover contact.

What is claimed is:

1. A thin film transistor for use in a flat plate display, comprising:
   an amorphous silicon layer;
   a gate electrode deposited on said amorphous silicon layer;
   a drain electrode connected with said gate electrode;
   a picture element electrode connected with said drain electrode;
   a source electrode deposited on said amorphous silicon layer and crossing said gate electrode, said source electrode further comprising a first source subelectrode and a second source subelectrode, said first and second source subelectrodes being arranged electrically parallel with each other.

* * * * *